US012772526B2

(12) United States Patent
Yeh

(10) Patent No.: US 12,772,526 B2
(45) Date of Patent: Oct. 20, 2026

(54) METHOD FOR FABRICATING HIGH ELECTRON MOBILITY TRANSISTOR

(71) Applicant: UNITED MICROELECTRONICS CORP., Hsin-Chu City (TW)

(72) Inventor: Chih-Tung Yeh, Taoyuan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 428 days.

(21) Appl. No.: 17/952,298

(22) Filed: Sep. 25, 2022

(65) Prior Publication Data

US 2024/0072126 A1 Feb. 29, 2024

(30) Foreign Application Priority Data

Aug. 26, 2022 (CN) ......................... 202211030955.2

(51) Int. Cl.

*H10D 30/01* (2025.01)
*H10D 30/47* (2025.01)
*H10D 30/67* (2025.01)
*H10D 62/824* (2025.01)
*H10D 62/85* (2025.01)
*H10D 64/01* (2025.01)
*H10D 64/64* (2025.01)

(52) U.S. Cl.

CPC ........... *H10D 64/01* (2025.01); *H10D 30/015* (2025.01); *H10D 30/475* (2025.01); *H10D 30/6738* (2025.01); *H10D 30/675* (2025.01); *H10D 62/824* (2025.01); *H10D 62/85* (2025.01); *H10D 62/8503* (2025.01); *H10D 64/64* (2025.01)

(58) Field of Classification Search

CPC ............... H10D 30/015; H10D 30/471; H10D 30/475; H10D 30/4755

See application file for complete search history.

(56) References Cited

U.S. PATENT DOCUMENTS 4,958,213 A * 9/1990 Eklund ................ H10D 84/038 257/378
9,412,856 B2 8/2016 Fujimoto
2006/0270140 A1 * 11/2006 Johnson ............... H10D 64/017 438/231
2011/0092057 A1 * 4/2011 Suvorov .............. H10D 62/149 257/E21.333
2014/0252368 A1 * 9/2014 Lee .................... H10D 30/4755 257/194

* cited by examiner

*Primary Examiner* — Tucker J Wright
(74) *Attorney, Agent, or Firm* — Winston Hsu

(57) ABSTRACT

A method for fabricating a high electron mobility transistor (HEMT) includes the steps of forming a buffer layer on a substrate, forming a barrier layer on the buffer layer, forming a p-type semiconductor layer on the barrier layer, performing an ion implantation process to form a hole injection buffer layer (HIBL) on the p-type semiconductor layer, and then forming a gate electrode on the HIBL.

5 Claims, 3 Drawing Sheets

METHOD FOR FABRICATING HIGH ELECTRON MOBILITY TRANSISTOR

BACKGROUND OF THE INVENTION

1. Field of the Invention

The invention relates to a method for fabricating high electron mobility transistor (HEMT).

2. Description of the Prior Art

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

According to an embodiment of the present invention, a method for fabricating a high electron mobility transistor (HEMT) includes the steps of forming a buffer layer on a substrate, forming a barrier layer on the buffer layer, forming a p-type semiconductor layer on the barrier layer, performing an ion implantation process to form a hole injection buffer layer (HIBL) on the p-type semiconductor layer, and then forming a gate electrode on the HIBL.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
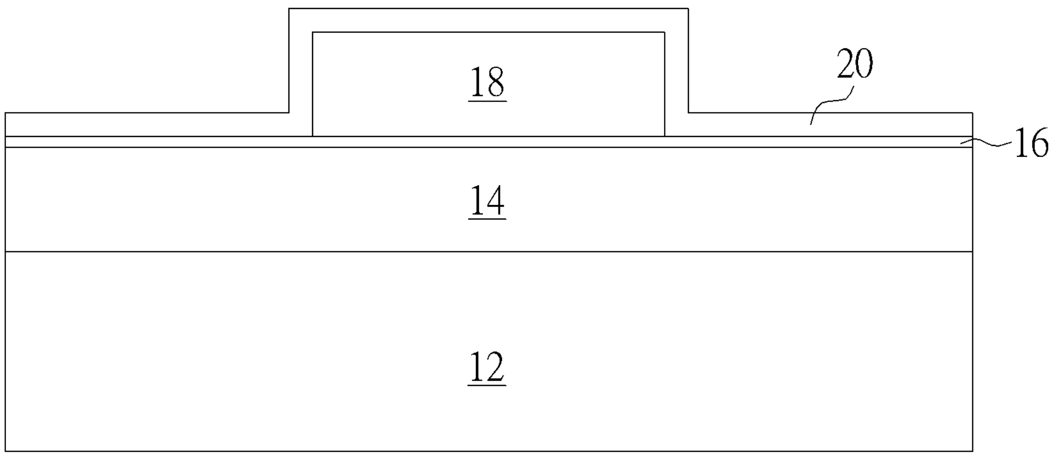
FIGS. 1-3 illustrate a method for fabricating a HEMT according to an embodiment of the present invention.
Figure 2:
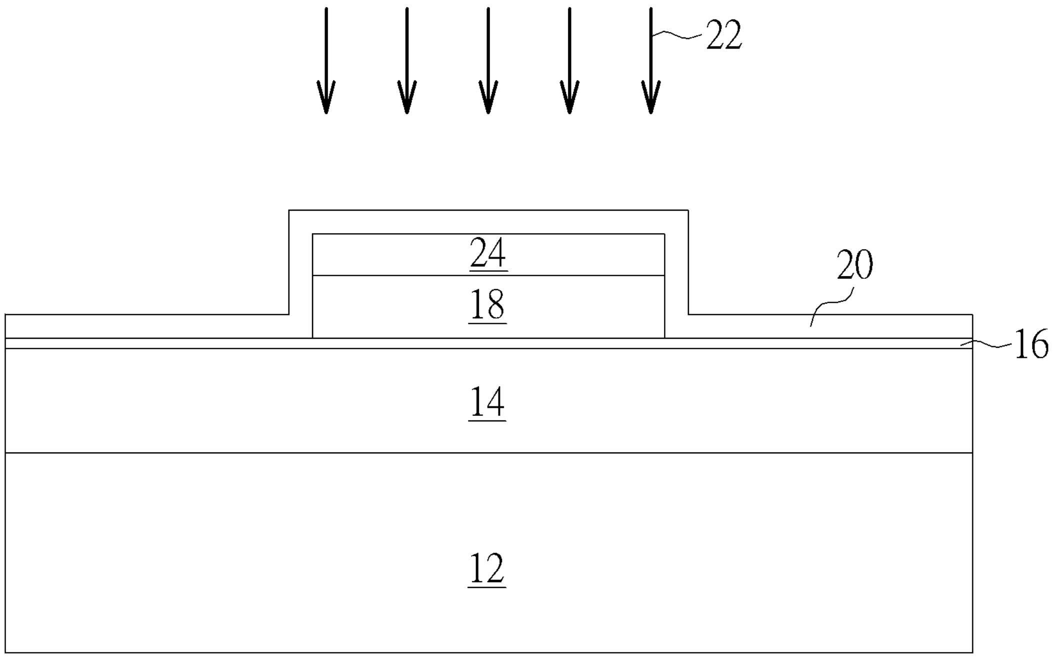
Figure 3:
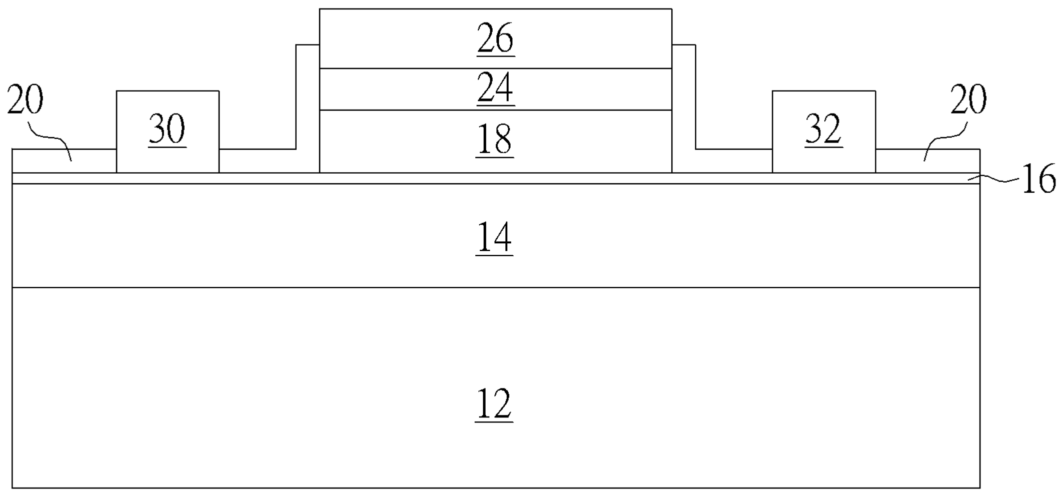

Referring to FIGS. 1-3, FIGS. 1-3 illustrate a method for fabricating a HEMT according to an embodiment of the present invention. As shown in FIG. 1, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate.

Next, a selective nucleation layer (not shown) and a buffer layer 14 are formed on the substrate 12. According to an embodiment of the present invention, the nucleation layer preferably includes aluminum nitride (AlN) and the buffer layer 14 is preferably made of III-V semiconductors such as gallium nitride (GaN), in which a thickness of the buffer layer 14 could be between 0.5 microns to 10 microns. According to an embodiment of the present invention, the formation of the buffer layer 14 on the substrate 12 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a selective unintentionally doped (UID) buffer layer (not shown) could be formed on the surface of the buffer layer 14. In this embodiment, the UID buffer layer is preferably made of III-V semiconductors such as gallium nitride (GaN) or more specifically unintentionally doped GaN. According to an embodiment of the present invention, the formation of the UID buffer layer on the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a barrier layer 16 is formed on the surface of the buffer layer 14 or UID buffer layer. In this embodiment, the barrier layer 16 is preferably made of III-V semiconductor such as n-type or n-graded aluminum gallium nitride ($Al_xGa_{1-x}N$), in which $0<x<1$, the barrier layer 16 preferably includes an epitaxial layer formed through epitaxial growth process, and the barrier layer 16 could include dopants such as silicon or germanium. Similar to the buffer layer 14, the formation of the barrier layer 16 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a p-type semiconductor layer 18 is formed on the barrier layer 16, a photo-etching process is conducted to pattern or remove part of the p-type semiconductor layer 18, and then a passivation layer 20 is formed on the p-type semiconductor layer 18. In this embodiment, the p-type semiconductor layer 18 is a III-V compound semiconductor layer preferably including p-type GaN (pGaN) and the formation of the p-type semiconductor layer 18 on the barrier layer 16 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof. Moreover, even though the passivation layer 20 in this embodiment pertains to be a single-layered structure, according to other embodiment of the present invention, it would also be desirable to form a passivation layer 20 made from a dual layer or tri-layer structure, in which the passivation layer 20 could include dielectric material including but not limited to for example silicon oxide, silicon nitride, or aluminum oxide.

Next, as shown in FIG. 2, a patterned mask (not shown) such as a patterned resist is formed to cover areas outside the p-type semiconductor layer 18, and then an ion implantation process 22 is conducted to form a hole injection buffer layer (HIBL) 24 on the p-type semiconductor layer 18. Specifically, the ion implantation process 22 conducted at this stage implants silicon atoms through the passivation layer 20 and into part of the p-type semiconductor layer 18 so that part of the p-type semiconductor layer 18 being injected with silicon atoms is transformed into a HIBL 24. Due to the block of the patterned mask, silicon atoms are preferably not implanted into the barrier layer 16 and/or buffer layer 14 adjacent to two sides of the p-type semiconductor layer 18. In this embodiment, the overall thickness of the HIBL 24 is about ⅓ or most preferably between ½ to ⅓ of the thickness of the p-type semiconductor layer 18.

Next, as shown in FIG. 3, a photo-etching process is conducted to remove part of the passivation layer 20 for exposing the p-type semiconductor layer 18 surface, a gate electrode 26 is formed on the surface of the HIBL 24, another photo-etching process is conducted to remove part of the passivation layer 20 adjacent to two sides of the gate electrode 26 for forming two openings (not shown), and conductive materials are formed into the openings along with additional photo-etching process for forming a source electrode 30 and a drain electrode 32 adjacent to two sides of the gate electrode 26. In this embodiment, the gate electrode 26, the source electrode 30, and the drain electrode 32 are preferably made of metal, in which the gate electrode 26 is preferably made of Schottky metal while the source electrode 30 and the drain electrode 32 are preferably made of ohmic contact metals.

According to an embodiment of the present invention, each of the gate electrode 26, source electrode 30, and drain electrode 32 could include gold (Au), Silver (Ag), platinum (Pt), titanium (Ti), aluminum (Al), tungsten (W), palladium (Pd), or combination thereof. Preferably, it would be desirable to conduct an electroplating process, sputtering process, resistance heating evaporation process, electron beam evaporation process, physical vapor deposition (PVD) process, chemical vapor deposition (CVD) process, or combination thereof to form electrode materials in the aforementioned openings, and then pattern the electrode materials through one or more etching processes to form the gate electrode 26, source electrode 30, and the drain electrode 32. This completes the fabrication of a HEMT according to an embodiment of the present invention.

Figure 4:
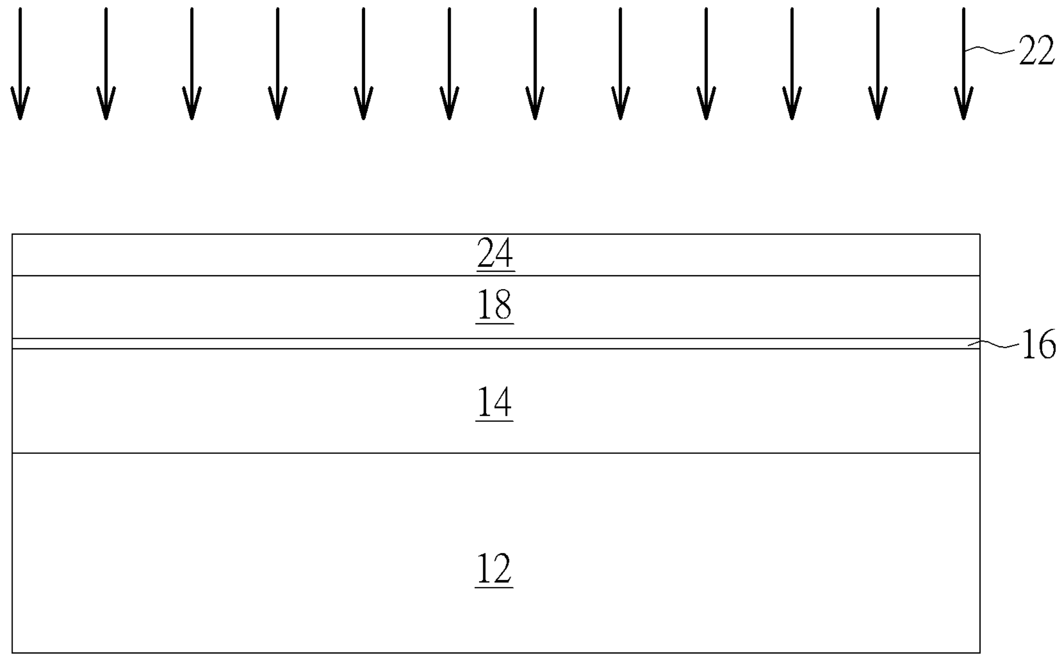
FIGS. 4-5 illustrate a method for fabricating a HEMT according to an embodiment of the present invention.
Figure 5:
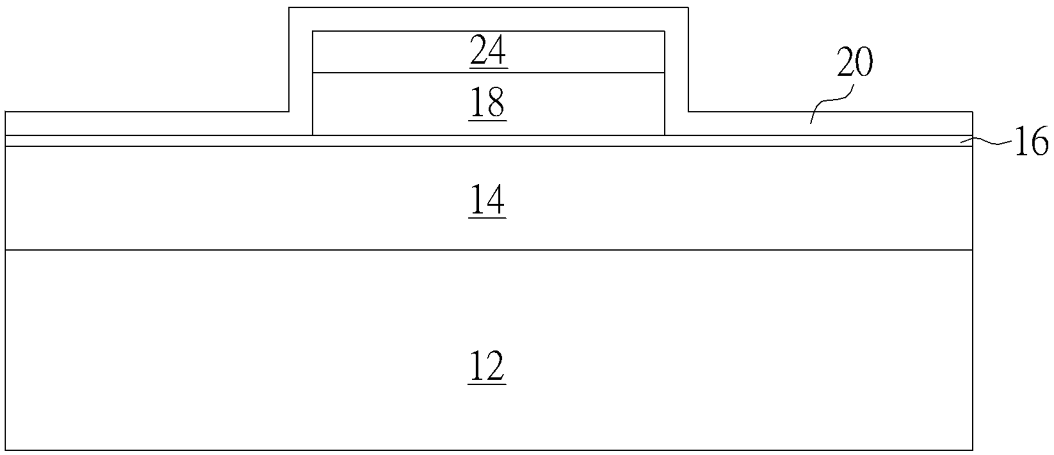

Referring to FIGS. 4-5, FIGS. 4-5 illustrate a method for fabricating a HEMT according to an embodiment of the present invention. As shown in FIG. 4, it would be desirable to first follow the process conducted in FIG. 1 by forming a buffer layer 14, a barrier layer 16, and a p-type semiconductor layer 18 on the substrate 12 and then conducting an ion implantation process 22 to implant silicon atoms into part of the p-type semiconductor layer 18 directly without patterning the p-type semiconductor layer 18. This then transforms part of the p-type semiconductor layer 18 into a HIBL 24 made of silicon. Similar to the aforementioned embodiment, the overall thickness of the HIBL 24 at this stage is approximately ⅓ or most preferably between ½ to ⅓ of the thickness of the p-type semiconductor layer 18.

Next, as shown in FIG. 5, a photo-etching process could be conducted by using a patterned mask (not shown) as mask to remove part of the HIBL 24 and part of the p-type semiconductor layer 18 to expose the barrier layer 16 on adjacent two sides, and then a passivation layer 20 is formed on the p-type semiconductor layer 18 thereafter. Next, it would be desirable to follow the process conducted in FIG. 3 by first removing part of the passivation layer 20 to expose the top surface of the HIBL 24, forming a gate electrode 26 on the surface of the HIBL 24, conducting another photo-etching process to remove part of the passivation layer 20 adjacent to two sides of the gate electrode 26 for forming two openings (not shown), and then forming conductive materials into the two openings with additional photo-etching process to form a source electrode 30 and drain electrode 32 adjacent to two sides of the gate electrode 26.

Overall, the present invention first forms a passivation layer on the surface of a patterned p-type semiconductor layer and then conducts an ion implantation process to inject silicon atoms into part of the p-type semiconductor layer for transforming part of the p-type semiconductor layer into a HIBL made of silicon. According to a preferred embodiment of the present invention, the silicon atoms within the HIBL could be used as donors to neutralize acceptors such as magnesium (Mg) on surface of the p-type semiconductor layer so that it would more difficult for holes to enter the p-type semiconductor layer and the barrier layer thereby reducing gate leakage. Moreover, HIBL could also be used to improve reliability test for high temperature gate bias (HTGB) of the HEMT device and increase Vg operating range so that more flexibility could be provided to the designers on circuit design.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a high electron mobility transistor (HEMT), comprising:

forming a buffer layer on a substrate;

forming a barrier layer on the buffer layer;

forming a p-type semiconductor layer on the barrier layer, wherein the p-type semiconductor layer comprises p-type gallium nitride (pGaN);

forming a passivation layer on and directly contacting the p-type semiconductor layer and the barrier layer, wherein the passivation layer directly contacts a top surface and a sidewall of the p-type semiconductor layer, and a top surface of the barrier layer;

performing an ion implantation process to implant silicon atoms into the p-type semiconductor layer to form a hole injection buffer layer (HIBL) comprising a silicon layer for neutralizing magnesium acceptors on a surface of the p-type semiconductor layer, wherein the silicon atoms of the ion implantation process are not implanted into the barrier layer and the buffer layer, and wherein the passivation layer remains covering the top surface of the p-type semiconductor layer while the ion implantation process is performed; and forming a gate electrode on the HIBL.

2. The method of claim 1, further comprising:

patterning the p-type semiconductor layer;

forming the passivation layer on the p-type semiconductor layer;

performing the ion implantation process to form the HIBL on the p-type semiconductor layer;

patterning the passivation layer to expose the HIBL;

forming the gate electrode on the HIBL; and forming a source electrode and a drain electrode adjacent to two sides of the gate electrode.

3. The method of claim 1, wherein a thickness of the silicon layer is less than a thickness of the p-type semiconductor layer.

4. The method of claim 1, wherein the buffer layer comprises gallium nitride (GaN).

5. The method of claim 1, wherein the barrier layer comprise $Al_xGa_{1-x}N$.

* * * * *